(12) United States Patent
Zhu

(10) Patent No.: US 10,115,641 B2
(45) Date of Patent: Oct. 30, 2018

(54) SEMICONDUCTOR ARRANGEMENT, METHOD OF MANUFACTURING THE SAME ELECTRONIC DEVICE INCLUDING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/718,610

(22) Filed: Sep. 28, 2017

(65) Prior Publication Data

US 2018/0096896 A1 Apr. 5, 2018

(30) Foreign Application Priority Data

Sep. 30, 2016 (CN) .......................... 2016 1 0872145

(51) Int. Cl.
*H01L 21/8234* (2006.01)
*H01L 27/088* (2006.01)
(Continued)

(52) U.S. Cl.
CPC ............ *H01L 21/823487* (2013.01); *H01L 21/823425* (2013.01); *H01L 27/088* (2013.01);
(Continued)

(58) Field of Classification Search
CPC ..... H01L 21/823487; H01L 21/823425; H01L 27/088; H01L 29/7827; H01L 29/7848; H01L 21/3065; H01L 21/3081
See application file for complete search history.

(56) References Cited

U.S. PATENT DOCUMENTS

| 6,720,617 B2* | 4/2004 | Einav ................. H01L 29/6675 257/329 |
| 7,944,035 B2* | 5/2011 | Bol ................... H01L 23/49833 257/139 |

(Continued)

FOREIGN PATENT DOCUMENTS

| CN | 105609421 A | 5/2016 |
| CN | 105810681 A | 7/2016 |

OTHER PUBLICATIONS

"Chinese Application Serial No. 201610872145.X, Office Action dated Aug. 3, 2018", (dated Aug. 3, 2018), 12 pgs.

*Primary Examiner* — Walter H Swanson
(74) *Attorney, Agent, or Firm* — Schwegman Lundberg & Woessner, P.A.

(57) ABSTRACT

There are provided a semiconductor arrangement, a method of manufacturing the same, and an electronic device including the semiconductor arrangement. According to an embodiment, the semiconductor arrangement may include a first semiconductor device and a second semiconductor device stacked in sequence on a substrate. Each of the first semiconductor device and the second semiconductor device may include a first source/drain layer, a channel layer and a second source/drain layer stacked in sequence, and a gate stack surrounding a periphery of the channel layer. The channel layer may comprise a semiconductor material different from that of the first source/drain layer and from that of the second source/drain layer.

14 Claims, 13 Drawing Sheets

(51) Int. Cl.
   *H01L 21/225*   (2006.01)
   *H01L 21/3065*  (2006.01)
   *H01L 21/308*   (2006.01)
   *H01L 29/04*    (2006.01)
   *H01L 29/78*    (2006.01)

(52) U.S. Cl.
   CPC ...... *H01L 21/2255* (2013.01); *H01L 21/3065* (2013.01); *H01L 21/3081* (2013.01); *H01L 29/04* (2013.01); *H01L 29/7827* (2013.01); *H01L 29/7848* (2013.01)

(56) References Cited

U.S. PATENT DOCUMENTS

| | | | |
|---|---|---|---|
| 2012/0138888 A1* | 6/2012 | Chang | H01L 27/1203 257/9 |
| 2012/0175626 A1 | 7/2012 | Erickson et al. | |
| 2015/0194423 A1 | 7/2015 | Wang et al. | |
| 2015/0340376 A1* | 11/2015 | Park | H01L 27/11582 257/329 |
| 2016/0126253 A1* | 5/2016 | Lee | H01L 27/1157 257/324 |
| 2016/0268382 A1* | 9/2016 | Colinge | H01L 29/267 |

\* cited by examiner

SEMICONDUCTOR ARRANGEMENT, METHOD OF MANUFACTURING THE SAME ELECTRONIC DEVICE INCLUDING THE SAME

CROSS-REFERENCE TO RELATED APPLICATION(S)

This application claims priority to Chinese Application No. 201610872145.X, filed on Sep. 30, 2016, entitled "SEMICONDUCTOR ARRANGEMENT, METHOD OF MANUFACTURING THE SAME AND ELECTRONIC DEVICE INCLUDING THE SAME," which is incorporated herein by reference in its entirety.

TECHNICAL FIELD

The present disclosure relates to the semiconductor field, and more particularly, to a semiconductor arrangement, a method of manufacturing the same, and an electronic device including the semiconductor arrangement.

BACKGROUND

In a planar device such as a Metal Oxide Semiconductor Field Effect Transistors (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

However, it is difficult for the vertical device, especially one whose channel includes a single-crystalline material, to control its gate length. On the other hand, the channel of a poly-crystalline material will have its resistance significantly increased compared to the single-crystalline material. Therefore, it is difficult to stack multiple vertical devices, because this will result in too high resistance.

SUMMARY

In view of the above, the present disclosure aims to provide, among others, a vertical semiconductor arrangement whose gate length can be well controlled, a method of manufacturing the same, and an electronic device including the semiconductor arrangement.

According to an aspect of the present disclosure, there is provided a semiconductor arrangement, comprising a first semiconductor device and a second semiconductor device stacked in sequence on a substrate. Each of the first semiconductor device and the second semiconductor device comprises a first source/drain layer, a channel layer and a second source/drain layer stacked in sequence, and a gate stack surrounding a periphery of the channel layer. The channel layer comprises a semiconductor material different from that of the first source/drain layer and from that of the second source/drain layer.

According to a further aspect of the present disclosure, there is provided a method of manufacturing a semiconductor arrangement, comprising: stacking a first source/drain layer, a channel layer and a second source/drain layer for a first semiconductor device, and also a first source/drain layer, a channel layer and a second source/drain layer for a second semiconductor device in sequence on a substrate; defining an active region for the semiconductor arrangement in the first source/drain layer, the channel layer and the second source/drain layer for the first semiconductor device, and the first source/drain layer, the channel layer and the second source/drain layer for the second semiconductor device; and forming respective gate stacks for the first semiconductor device and the second semiconductor device to surround a periphery of the respective channel layers for the first semiconductor device and the second semiconductor device, respectively.

According to a further aspect of the present disclosure, there is provided an electronic device comprising an Integrated Circuit (IC) comprising the above described semiconductor arrangement.

According to embodiments of the present disclosure, the gate stack surrounds the periphery of the channel layer and the channel is formed in the channel layer. Thus, the gate length is determined substantially by the thickness of the channel layer. The channel layer may be formed by, for example, epitaxy, and thus the thickness thereof can be well controlled. The periphery of the channel layer may be recessed inwards with respect to that of the first and second source/drain layers, so that the gate stack can be embedded into the recess, to reduce or even avoid overlap with the source/drain regions and thus contribute to reduced parasitic capacitance between the gate and the source/drain. Further, the channel layer may comprise a single-crystalline semiconductor material, resulting in improved carrier mobility and lower current leakage and thus enhanced device performances. Since vertical devices are relatively easy to be stacked on each other, it is possible to save footprint and thus reduce manufacture cost.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1:
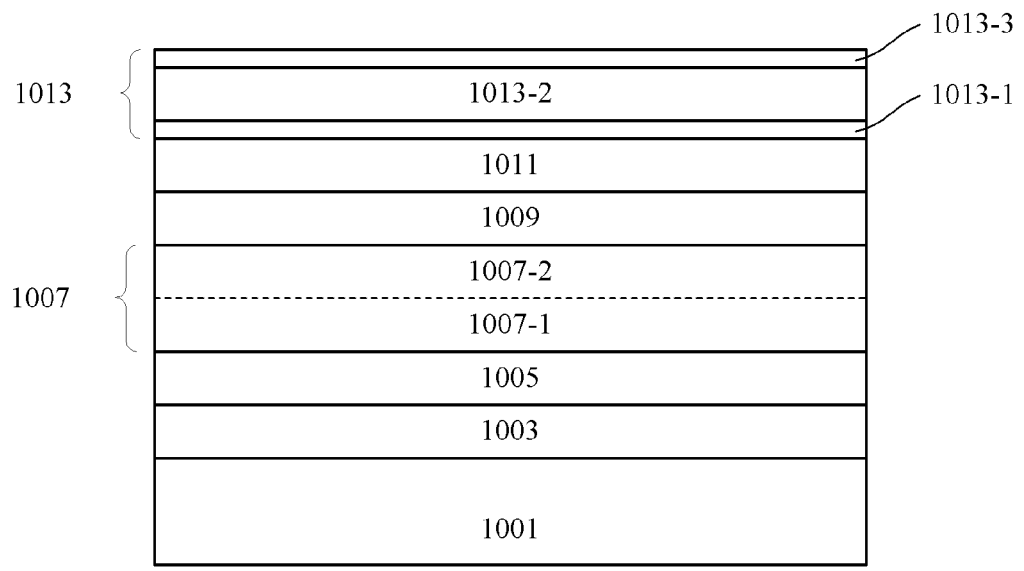
FIGS. 1-24 are schematic views showing a flow of manufacturing a semiconductor arrangement according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/ element interposed therebetween. Further, if a layer/element is "on" a further layer/element in an orientation, then the layer/element can be "under" the further layer/element when the orientation is turned.

A semiconductor arrangement according to embodiments of the present disclosure may include a first semiconductor device and a second semiconductor device stacked sequentially on a substrate, each of which is a vertical device. Such a vertical device may include a first source/drain layer, a channel layer and a second source/drain layer stacked sequentially. Source/drain regions of the device may be formed in the first source/drain layer and the second source/drain layer, while a channel region of the device may be formed in the channel layer. A conductive channel may be formed through the channel region between the source/drain regions on opposite ends of the channel region. A gate stack may be formed to surround a periphery of the channel layer. As a result, a gate length may be determined substantially by the thickness of the channel layer itself, rather than depending on timing etching as in the conventional art. The channel layer may be formed by, for example, epitaxy, and thus the thickness thereof can be well controlled. Therefore, the gate length can be well controlled. The channel layer may have its periphery recessed to that of the first and second source/drain layers. Then, the formed gate stack may be embedded into a recess of the channel layer with respect to the first and second source/drain layers, thereby reducing or even avoiding overlap with the source/drain regions and thus contributing to reduced parasitic capacitance between the gate and the source/drain. The channel layer may be made of a single-crystalline semiconductor material to improve device performances. In particular, it is possible to reduce the resistance of the channel, and thus facilitate stacking of such vertical devices. Certainly, the source/drain layers may also be made of a single-crystalline semiconductor material. In this case, the single-crystalline material of the channel layer and that of the source/drain layers may be a cocrystal.

According to embodiments of the present disclosure, doping of the source/drain regions may move partially into end portions of the channel layer close to the first source/drain layer and the second source/drain layer. As a result, there may be a doping distribution in the end portions of the channel layer close to the first source/drain layer and the second source/drain layer, while helps reducing resistance between the source/drain region and the channel region when the device is ON and thus improving the device performances.

According to embodiments of the present disclosure, the channel layer may comprise a semiconductor material different from that of the first and second source/drain layers. Thus, it facilitates processing the channel layer by, for example, selective etching, to recess the channel layer with respect to the first and second source/drain layers. Further, the first source/drain layer and the second source/drain layer may comprise the same semiconductor material as each other.

The first semiconductor device and the second semiconductor device may be electrically connected to each other. For example, such electrical connection may be achieved by the fact that the second source/drain layer of the first semiconductor device and the first source/drain layer of the second semiconductor device are contiguous to each other, i.e., in direct physical contact with each other. In this case, the second source/drain layer of the first semiconductor device and the first source/drain layer of the second semiconductor device may be even integral with each other, that is, they are provided by one same semiconductor layer.

Since the first and second semiconductor devices are both vertical devices and stacked on each other, the source/drain layers (where the source/drain regions of the devices are formed) other than the second source/drain layer of the second semiconductor device which is the uppermost one and also the gate stacks surrounding the respective channel layers cannot have electrical contact thereto directly formed above them. Therefore, to form electrical connections to those parts, laterally offset electrical contacts may be formed and then connected to those parts by respective laterally extending parts. For example, the gate stack (specifically, a gate conductor therein) surrounding the channel layer may comprise a laterally extending portion extending outwards from the corresponding recess. The laterally extending portion may extend beyond a periphery of the defined active region, so that an electrical contact thereto may be formed above it later. For the second source/drain layer of the first semiconductor device and the first source/drain layer of the second semiconductor device, an electrical contact layer contiguous thereto may be provided. The electrical contact layer may surround a periphery of the second source/drain layer of the first semiconductor device and the first source/drain layer of the second semiconductor device, to reduce contact resistance. The electrical contact layer may have one portion thereof protruding with respect to the remaining portion thereof and extending beyond the defined active region, so that an electrical contact thereto may be formed above it later. For the first source/drain layer of the first semiconductor device which is the lowermost one, it may be patterned in such a manner that its lower portion extends beyond a periphery of its upper portion, so that an electrical contact thereto may be formed above it later.

Since there are several such laterally extending portions, at least some of those laterally extending portions may extend laterally in different directions, to prevent their respective electrical contacts from interfering with each other. If some of the laterally extending portions overlap with each other in a vertical direction, then among those laterally extending portions that overlap with each other, a lower one may protrude with respect to an upper one, to prevent their respective electrical contacts from interfering with each other.

Such a semiconductor arrangement may be manufactured as follows. Specifically, a first source/drain layer, a channel layer and a second source/drain layer for a first semiconductor device, and also a first source/drain layer, a channel layer and a second source/drain layer for a second semiconductor device may be stacked in sequence on a substrate. For example, those layers may be provided by epitaxy. The channel layer may have its thickness well controlled in the epitaxy process. Further, as described above, the second source/drain layer for the first semiconductor device and the first source/drain layer for the second semiconductor device may be integral with each other, i.e., one same layer.

For the respective layers stacked as above, an active region may be defined therein. For example, those layers may be selectively etched in sequence into a desired shape. Generally, the active region may have a pillar shape (for example, a cylindrical shape). The etching may be carried out layer by layer from top down. As described above, the etching of the first source/drain layer for the first semiconductor device, which is the lowermost one, may be performed with respect to the upper portion of this layer, so that the lower portion of this layer may extend beyond the periphery of the upper portion, for convenience of electrical connection to the source/drain region formed in this layer.

Then, gate stacks may be formed to surround a periphery of the respective channel layers.

Further, the periphery of the respective channel layers may be recessed with respect to a periphery of corresponding first and second source/drain layers, to define spaces for receiving the respective gate stacks. For example, this can be done by selective etching. In this way, the gate stacks may be embedded into the respective recesses.

Source/drain regions may be formed in the first and second source/drain layers of the respective devices. For example, this can be done by doping the first and second source/drain layers. For example, ion implantation or plasma doping may be performed, or the first and second source/drain layers may be doped in situ while being grown. In an advantageous example, sacrificial gates may be formed in the respective recesses of the periphery of the gates with respect to the periphery of the first and second source/drain layers. Then, a dopant source layer may be formed on surfaces of the first and second source/drain layers, and dopants may be driven by, for example, annealing, from the dopant source layer into the active region via the first and second source/drain layers. The sacrificial gates may prevent the dopants from directly moving into the channel layers. However, some of the dopants may move into end portions of the respective channel layers close to the first and second source/drain layers through the first and second source/drain layers. For the first and second semiconductor devices, the formation of the source/drain regions may be conducted simultaneously (in a case where their respective source/drain layers have the same or similar doping conductivity, for example) or separately (in a case where their respective source/drain layers have different doping conductivities, for example).

The technology of the present disclosure can be implemented in various ways, some of which are exemplified in the following with reference to the drawings.

FIGS. 1-24 are schematic views showing a flow of manufacturing a semiconductor arrangement according to an embodiment of the present disclosure.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description.

On the substrate 1001, a first source/drain layer 1003, a first channel layer 1005, a second source/drain layer 1007, a second channel layer 1009, and a third source/drain layer 1011 are formed in sequence by, for example, epitaxy. As an example, for a p-type device, the first source/drain layer 1003 may comprise a suitable semiconductor material such as SiGe (with an atomic percentage of Ge being about 10-40%), with a thickness of about 20-50 nm; the first channel layer 1005 may comprise a semiconductor material different from that of the first source/drain layer 1003 and the second source/drain layer 1007, such as Si, with a thickness of about 10-100 nm; the second source/drain layer 1007 may comprise the same semiconductor material as the first source/drain layer 1003, such as SiGe (with an atomic percentage of Ge being about 10-40%); the second channel layer 1009 may comprise a semiconductor material different from that of the second source/drain layer 1007 and the third source/drain layer 1011, such as Si, with a thickness of about 10-100 nm; the third source/drain layer 1011 may comprise the same semiconductor material as the second source/drain layer 1007, such as SiGe (with an atomic percentage of Ge being about 10-40%), with a thickness of about 20-50 nm. SiGe has a greater lattice constant than Si, without being strained. The materials for the source/drain layers and the channel layers are not limited thereto. Other semiconductor materials are also possible as long as they can provide appropriate etching selectivity. As another example, for an n-type device, the first source/drain layer 1003, the second source/drain layer 1007, and the third source/drain layer 1011 may comprise Si:C ((with an atomic percentage of C being about 0.1-5%), while the first channel layer 1005 and the second channel layer 1009 may comprise Si. Si:C has a smaller lattice constant than Si, without being strained. Certainly, the present disclosure is not limited thereto. For example, each of the channel layers may comprise the same components as the underlying and overlying source/drain layers, but with different contents of the components (for example, they all comprise SiGe, but with different atomic percentages of Ge), as long as the channel layer has etching selectivity with respect to the underlying and overlying source/drain layers.

In this example, the first source/drain layer 1003, the first channel layer 1005, and a lower portion 1007-1 of the second source/drain layer 1007 (with a thickness of about 10-50 nm, for example) can be used to define an active region for a first semiconductor device, and an upper portion 1007-2 of the second source/drain layer 1007 (with a thickness of about 10-50 nm, for example), the second channel layer 1009, and the third source/drain layer 1011 can be used to define an active region for a second semiconductor device. Here, the first semiconductor device and the second semiconductor device are contiguous to each other, and share the common source/drain layer 1007. However, the present disclosure is not limited thereto. For example, the source/drain layer 1007-1 for the first semiconductor device and the source/drain layer 1007-2 for the second semiconductor device may be grown separately, and may comprise the same or different semiconductor materials. The first semiconductor device and the second semiconductor device may be even separated from each other, with a dielectric layer interposed therebetween, so that they are electrically isolated from each other. For example, the dielectric layer may be deposited between the source/drain layer 1007-1 for the first semiconductor device and the source/drain layer 1007-2 for the second semiconductor device.

The source/drain layers 1003, 1007, and 1011 may be doped in situ when being grown so as to form source/drain regions therein. For example, n-type doping may be performed for an n-type device, and p-type doping may be performed for a p-type device. The first semiconductor device and the second semiconductor device may have the same doping type or different doping types.

Further, the channel layers 1005 and 1009 may also be doped in situ when being grown, to adjust threshold voltages (Vt) of the respective devices. For example, p-type doping may be performed at a doping concentration of about 1E17-1E19 cm$^{-3}$ for an n-type device, and n-type doping may be performed at a doping concentration of about 1E17-1E19 cm$^{-3}$ for a p-type device.

Further, for a junction-less device, the respective source/drain layers 1003, 1007, and 1011, and the channel layers 1005 and 1009 may be doped at the same conductivity.

In this example, the first source/drain layer 1003 is additionally grown on the substrate 1001. However, the present disclosure is not limited thereto. For example, the first source/drain layer may be provided by the substrate

1001 itself. In this case, a well region may be formed in the substrate to form a source/drain region therein.

Further, for convenience of patterning and providing appropriate stopper in the following process, a hard mask 1013 may be formed on those grown semiconductor layers. In this example, the hard mask 1013 may comprise a first hard mask layer 1013-1, a second hard mask layer 1013-2, and a third hard mask layer 1013-3 stacked in sequence. For example, the first hard mask layer 1013-1 may comprise oxide (such as silicon oxide) with a thickness of about 2-10 nm, the second hard mask layer 1013-2 may comprise nitride (such as silicon nitride) with a thickness of about 10-100 nm, and the third hard mask layer 1013-3 may comprise oxide with a thickness of about 20-10 nm. Such a stack configuration of the hard mask 1013 functions mainly to provide appropriate etching selectively in the following process. Those skilled in the art can conceive other configurations.

Figure 2A:
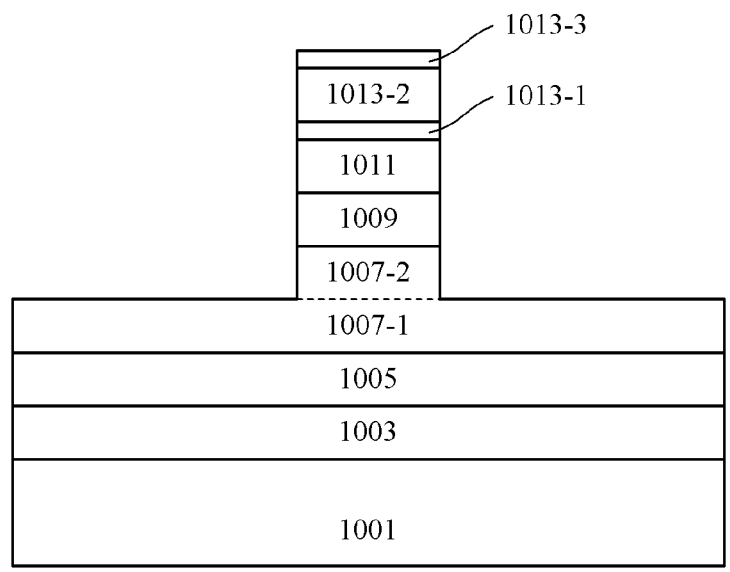
Figure 2B:
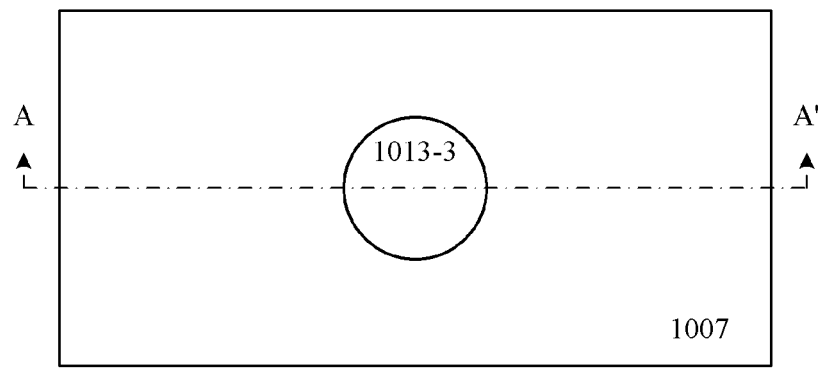

Next, active regions can be defined for the devices. For example, this can be done as follows. Specifically, as shown in FIGS. 2(*a*) and 2(*b*) (FIG. 2(*a*) is a sectional view, and FIG. 2(*b*) is a top view with line AA' indicating the location where the sectional view is taken), photoresist (not shown) may be formed on the hard mask 1013, and then patterned into a desired shape (a substantially circular shape in this example) by photolithography (exposing and developing). Then, the shape of the patterned photoresist may be transferred to the hard mask 1013. For example, the third hard mask layer 1013-3, the second hard mask layer 1013-2, and the first hard mask layer 1013-1 may be selectively etched by, for example, Reactive Ion Etching (RIE) in sequence. Then, the third source/drain layer 1011, the second channel layer 1009, and the second source/drain layer 1007 may be selectively etched by, for example, RIE in sequence. The etching goes into the second source/drain layer 1007, but stops before reaching a bottom surface of the second source/drain layer 1007, so that the upper portion 1007-2 of the second source/drain layer 1007 is patterned into a shape corresponding to the hard mask, while the lower portion 1007-1 thereof remains almost unchanged. Thus, the third source/drain layer 1011, the second channel layer 1009, and the upper portion 1007-2 of the second source/drain layer 1007 are in a pillar shape (a cylindrical shape in this case) after being etched. The RIE may be performed in, for example, a direction substantially perpendicular to a surface of the substrate, and thus the pillar shape extends in the direction substantially perpendicular to the substrate surface. After that, the photoresist may be removed.

For a p-type device, Si is strained after the RIE, because SiGe has a greater lattice constant than Si without being strained. The strain will cause the mobility of holes in Si become greater than that if without the strain, or cause the effective mass of light holes in Si become smaller than that if without the strain, or cause the concentration of light holes in Si become greater than that if without the strain, so that the p-type device will have an increased ON current and thus has its performances improved. Alternatively, for an n-type device, Si is strained after the RIE, because Si:C has a smaller lattice constant than Si, without being strained. The strain will cause the mobility of electrons in Si become greater than that if without the strain, or cause the effective mass of electrons in Si become smaller than that if without the strain, so that the n-type device will have an increased ON current and thus has its performances improved.

Further, if SiGe is selected to be used as the material for the channel layer and Si is selected to be used as the material for the source/drain layers, this selection will result in an increased ON current and a reduced OFF current for the p-type device, so that the p-type device's performances are improved. This is because Si has a forbidden band gap greater than that of SiGe, and the mobility of holes in SiGe is higher than that in Si.

Figure 3:
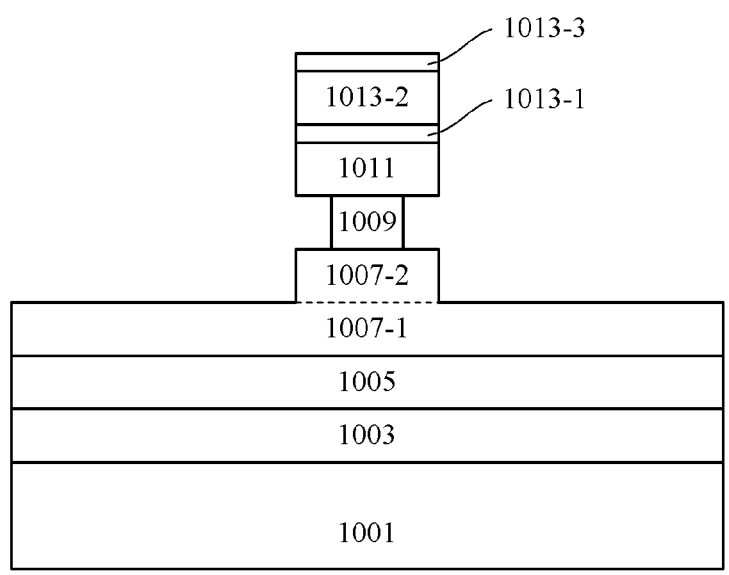

Then, as shown in FIG. 3, a periphery of the second channel layer 1009 may be recessed (in this example, in a lateral direction substantially parallel to the substrate surface) with respect to that of the upper portion 1007-2 of the second source/drain layer and the third source/drain layer 1011. For example, this can be done by selectively etching the second channel layer 1009 further with respect to the second source/drain layer 1007 and the third source/drain layer 1011. As an example, especially in a case where the source/drain layers are Si and the channel layer is SiGe, digital etching may be adopted. Specifically, a surface oxide layer may be formed on surfaces of the Si source/drain layers and the SiGe channel layer by thermal treatment, and then removed by etching. Oxidation of SiGe is faster than that of Si, and the oxide on SiGe is easier to be removed. Those steps of oxidation and oxide removing can be repeated to achieve the desired recess. In this way, it is possible to well control the recess as compared to the conventional selective etching.

Thus, the active region for the second semiconductor device is defined (i.e., the upper portion 1007-2 of the second source/drain layer, the second channel layer 1009, and the third source/drain layer 1011, after being etched). In this example, the active region is substantially in a pillar shape. In the active region, the upper portion 1007-2 of the second source/drain layer may have its periphery substantially aligned with that of the third source/drain layer 1011, while the periphery of the second channel layer 1009 is relatively recessed. Certainly, the active region is not limited to the specific shape illustrated, but can be formed in different shapes according to design layout. For example, the active region may be in an ellipse, a square, a rectangle, or the like in the top view.

Figure 4:
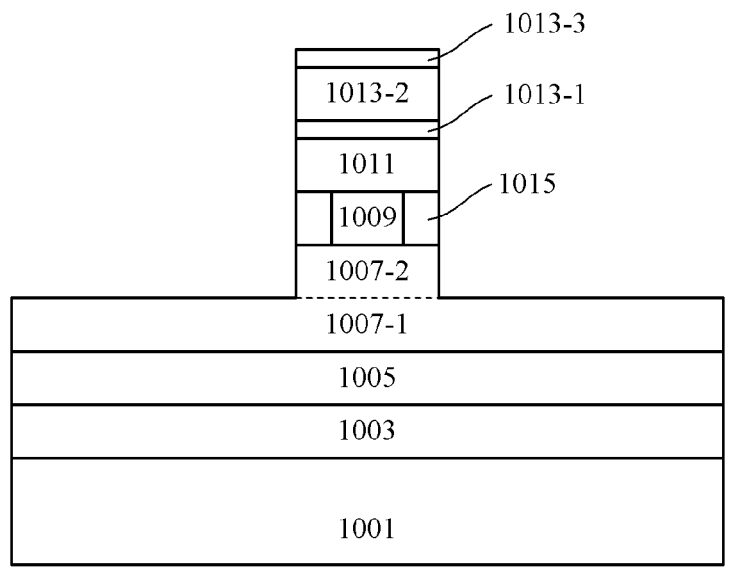

In the recess of the second channel layer 1009 with respect to the upper portion 1007-2 of the second source/drain layer and the third source/drain layer 1011, a gate stack will be formed later. To prevent the following process from impacting the channel layer 1009 or leaving some unwanted material(s) in this recess which will impede the formation of the gate stack, a material layer may be filled in the recess to occupy the space for the gate stack (and thus, this material layer may be referred to as a "sacrificial gate"). For example, this can be done by depositing nitride on the structure shown in FIG. 3 and then etching the deposited nitride back by, for example, RIE. The RIE may be performed in a direction substantially perpendicular to the substrate surface, so that the nitride can be left only within the recess, resulting in the sacrificial gate 1015, as shown in FIG. 4. In this case, the sacrificial gate 1015 may substantially fill the recess up.

Figure 5:
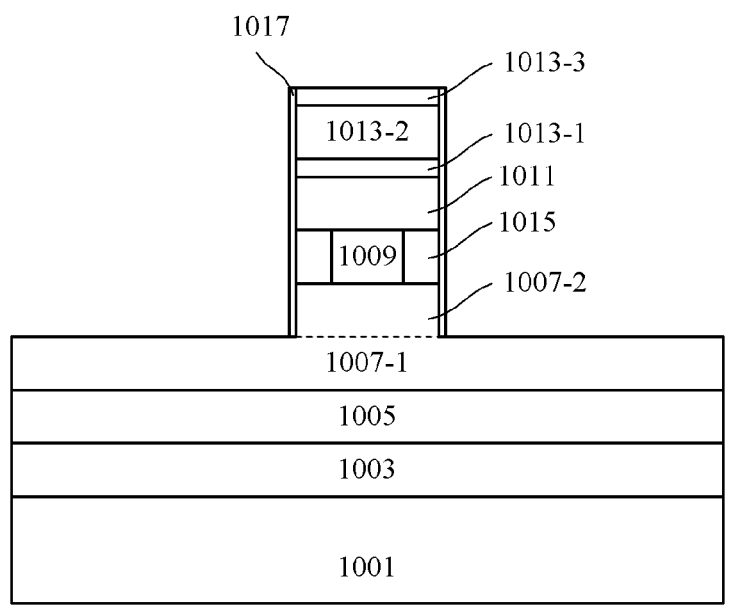

Optionally, the upper portion 1007-2 of the second source/drain layer and the third source/drain layer 1011 may be further doped, especially if the doping concentration by the in situ doping described above is not enough. Specifically, as shown in FIG. 5, a dopant source layer 1017 may be formed on the structure shown in FIG. 4. For example, the dopant source layer 1017 may comprise oxide such as silicon oxide, containing dopants therein. N-type dopants can be included for an n-type device, and p-type dopants can be included for a p-type device. Here, to suppress influence of the dopant source layer 1017 on the lower portion 1007-1 of the second source/drain layer for the other device (i.e., the first semiconductor device) (especially if the first semiconductor device and the second semiconductor device have different source/drain doping conductivities), the dopant source layer 1017 may be formed as a spacer on sidewalls of the active region for the second semiconductor device (actually on sidewalls of the upper portion 1007-2 of the second source/drain layer and the third source/drain layer 1011, due to the presence of the sacrificial gate 1015). For example, a thin film may be formed in a substantially conformal manner on a surface of the structure shown in FIG. 4 by, for example, Chemical Vapor Deposition (CVD) or Atom Layer Deposition (ALD), and then undergo RIE in a direction substantially perpendicular to the substrate surface, resulting in the dopant source layer 1017 as a spacer.

Figure 6:
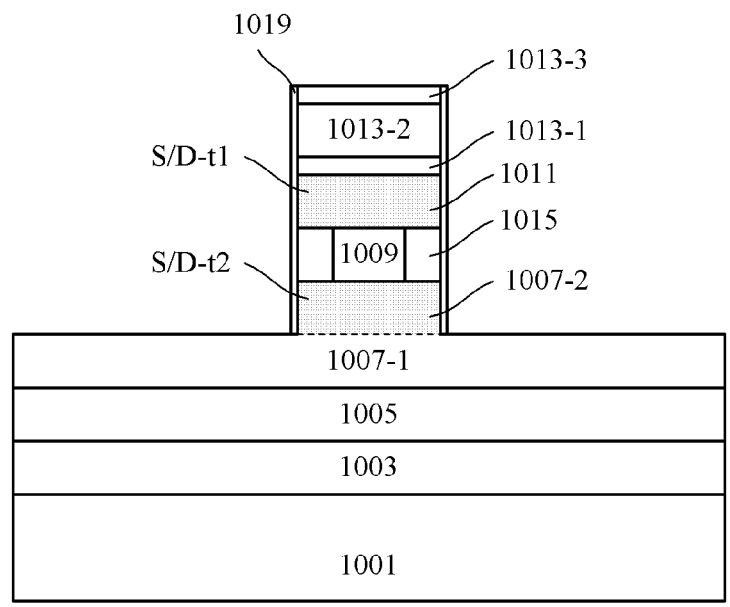

Next, as shown in FIG. 6, the in situ doped impurities may be activated or the dopants included in the dopant source layer 1017 may be driven into the active region by, for example, annealing, so that doped regions are formed therein, as indicated by shadowed regions in the figure. More specifically, one source/drain region S/D-t1 for the second semiconductor device may be formed in the third source/drain layer 1011, and another source/drain region S/D-t2 for the second semiconductor device may be formed in the upper portion 1007-2 of the second source/drain layer. After that, the dopant source layer 1017 may be removed.

Further, in spite of the sacrificial gate 1015, the dopants may go into the second channel layer 1009 via the upper portion 1007-2 of the second source/drain layer and the third source/drain layer 1011, so that the second channel layer 1009 may have its top and bottom ends with some doping distribution (not shown). Such doping distribution helps to reduce the resistance between the source/drain regions when the device is ON, resulting in improved device performances.

Figure 7:
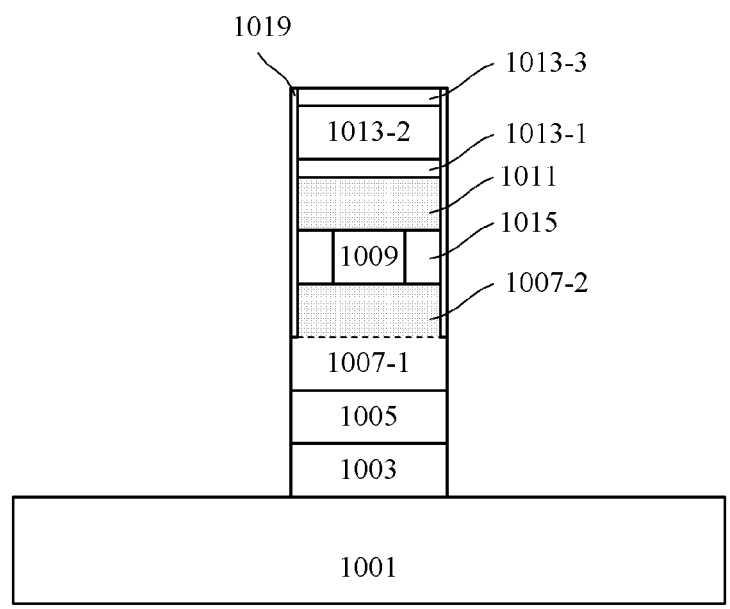

Next, similar process can be conducted for the first semiconductor device. To prevent the active region (especially the source/drain regions) of the second semiconductor device from being impacted in the following process (especially to suppress cross contamination of the dopants), a protective layer 1019 may be formed around the active region, as shown in FIG. 7. The protective layer 1019 may be also formed as a spacer.

Then, the active region for the first semiconductor device may be defined. As shown in FIG. 7, the lower portion 1007-1 of the second source/drain layer, the first channel layer 1005, and the first source/drain region 1003 may be selectively etched by, for example, RIE, in sequence, with the hard mask 1013 and the protective 1019 provided. Here, the etching may be conducted to a bottom surface of first source/drain region 1003. However, the present disclosure is not limited thereto. For example, the etching may go into the first source/drain region 1003, but stop before reaching the bottom surface of first source/drain region 1003, so that the first source/drain region 1003 has its upper portion etched, while its lower portion remains almost unchanged. Thus, the lower portion 1007-1 of the second source/drain layer, the first channel layer 1005, and the first source/drain region 1003 (or the upper portion thereof) are in a pillar shape (a cylindrical shape in this case) after being etched. The RIE may be performed in, for example, a direction substantially perpendicular to the substrate surface, and thus the pillar shape extends in the direction substantially perpendicular to the substrate surface.

Figure 8:
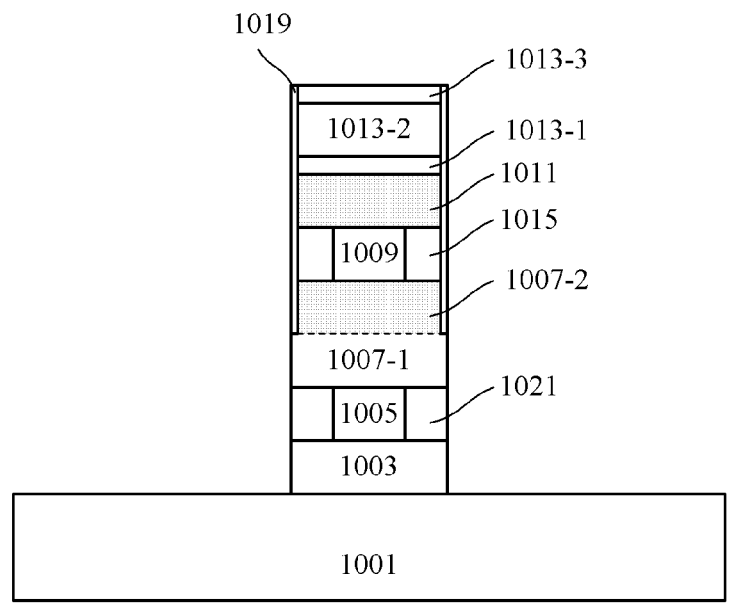

Likewise, a periphery of the first channel layer 1005 may be recessed (in this example, in a lateral direction substantially parallel to the substrate surface) with respect to that of the lower portion 1007-1 of the second source/drain layer and the first source/drain layer 1003 (or the upper portion thereof), as shown in FIG. 8. For example, this can be done by selectively etching the first channel layer 1005 further with respect to the second source/drain layer 1007 and the first source/drain layer 1003. Likewise, this can be achieved by digital etching.

Thus, the active region for the first semiconductor device is defined (i.e., the lower portion 1007-1 of the second source/drain layer, the first channel layer 1005, and the first source/drain layer 1003, after being etched). In this example, the active region is substantially in a pillar shape, and is substantially aligned to the active region for the second semiconductor device (due to the usage of the same mask). In the active region, the lower portion 1007-1 of the second source/drain layer may have its periphery substantially aligned with that of the first source/drain layer 1003 (or its upper portion), while the periphery of the first channel layer 1005 is relatively recessed. As described above, a sacrificial gate 1021 may be formed in this recess, as shown in FIG. 8. The sacrificial gate 1021 may comprise nitride, for example. As described above, this can be done by depositing nitride and then etching the deposited nitride back. To improve the selectivity or process control, a thin oxide film (with a thickness of, for example, about 1-5 nm) may be deposited before depositing the nitride.

Figure 9:
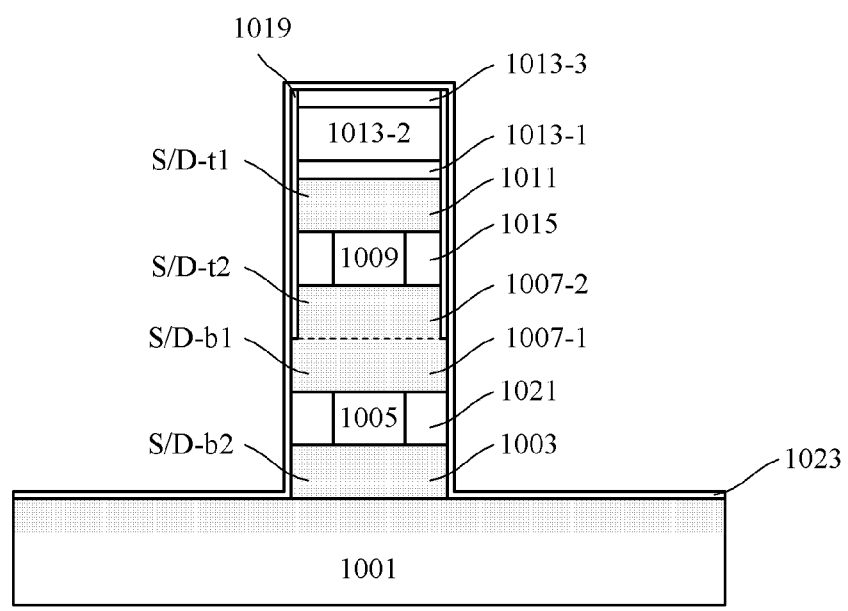

Similarly, the lower portion 1007-1 of the second source/drain layer and the first source/drain layer 1003 may be further doped optionally, especially if the doping concentration by the in situ doping described above is not enough. Specifically, as shown in FIG. 9, a dopant source layer 1023 may be formed on the structure shown in FIG. 8. For example, the dopant source layer 1023 may comprise oxide such as silicon oxide, containing dopants therein. N-type dopants can be included for an n-type device, and p-type dopants can be included for a p-type device. Here, the dopant source layer 1023 is a thin film, and thus can be deposited in a substantially conformal manner on a surface of the structure shown in FIG. 8 by, for example, CVD or ALD.

Figure 10:
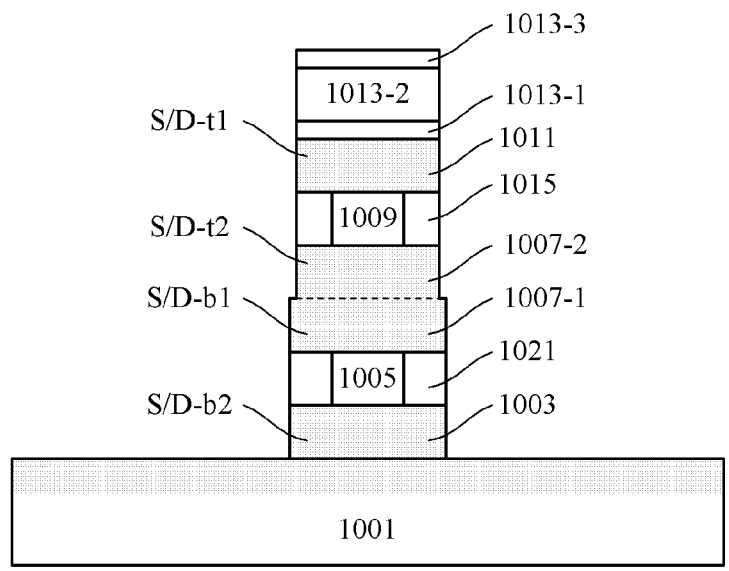

Next, the in situ doped impurities may be activated or the dopants included in the dopant source layer 1023 may be driven into the active region by, for example, annealing, so that doped regions are formed therein, as indicated by the shadowed regions in FIG. 9. More specifically, one source/drain region S/D-b1 for the first semiconductor device may be formed in the lower portion 1007-1 of the second source/drain layer, and another source/drain region S/D-b2 for the first semiconductor device may be formed in the first source/drain layer 1003. Due to the presence of the protective layer 1019, it is possible to suppress diffusing of the dopants from the dopant source layer 1023 into the active region for the second semiconductor device. After that, the dopant source layer 1023 and the protective layer 1019 may be removed by, for example, selective etching, as shown in FIG. 10.

In this example, the dopant source layer 1023 comprises a portion extending along the horizontal surface of the substrate 1001. As a result, a doped region may be formed even along the surface of the substrate 1001, and extend beyond the periphery of the pillar shaped active region. In this way, it is relatively easy to make electrical contact to the source/drain region S/D-b2 through this doped region in the following process.

In the above example, the source/drain regions are formed by driving the dopants from the dopant source layer to the active region. However, the present disclosure is not limited thereto. For example, the source/drain regions may be formed by ion implantation, plasma doping, or the like.

In the above example, the active regions are defined separately for the first semiconductor device and the second semiconductor device. However, the present disclosure is not limited thereto. The active regions for the first semiconductor device and the second semiconductor device may be defined at the same time. For example, in the above descriptions in conjunction with FIG. 3, the selective etching goes on, instead of being stopped at the upper portion of the second source/drain layer 1007, until reaching the first source/drain layer 1003 (e.g., reaching its bottom surface or somewhere between its top and bottom surfaces). In this way, the third source/drain layer 1011, the second channel layer 1009, the second source/drain layer 1007, the first channel layer 1005, and the first source/drain layer 1003 (or an upper portion thereof) are in a pillar shape after being etched. Then, the first channel layer 1005 and the second channel layer 1009 may be relatively recessed. For example, this can be done by selectively etching the first channel layer 1005 and the second channel layer 1009 (Si) with respect to the third source/drain layer 1011, the second source/drain layer 1007, and the first source/drain layer 1003 (SiGe). Sacrificial gates may be formed in the respective recesses of the first channel layer 1005 and the second channel layer 1009 at the same time by depositing nitride and then etching it back.

Further, in the above example, supplementary doping of the source/drain regions is done by using the respective dopant source layers for the first semiconductor device and the second semiconductor device, respectively. However, the present disclosure is not limited thereto. Supplementary doping of the source/drain regions may be done at the same time for the first semiconductor device and the second semiconductor device. For example, after the active regions for the first semiconductor device and the second semiconductor device are defined (and the sacrificial gates are formed) as described above, one same dopant source layer may be formed on the sidewalls of the active regions of the first semiconductor device and the second semiconductor device, and dopants may be driven from the dopant source layer into the active region.

Figure 11:
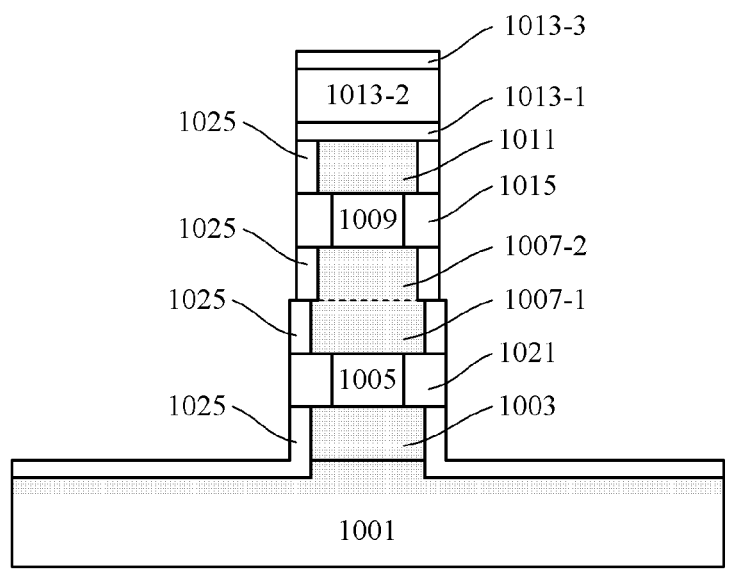

Optionally, to reduce contact resistance, silicide 1025 may be formed on the surfaces of the source/drain regions, as shown in FIG. 11. For example, the silicide 1025 may be formed by depositing a metal layer (for example, Ni, NiPt, or Co) on the structure shown in FIG. 10 and then annealing to make the metal layer react with the semiconductor materials. In this example, the silicide 1025 is also present on the surface of the substrate 1001. Then, the remaining unreacted metal may be removed.

An isolation layer may be formed around the active region for electrical isolation. Here, the isolation layer may be formed layer by layer in several steps, in consideration of the later formation of gate stacks and an electrical contact layer.

Figure 12:
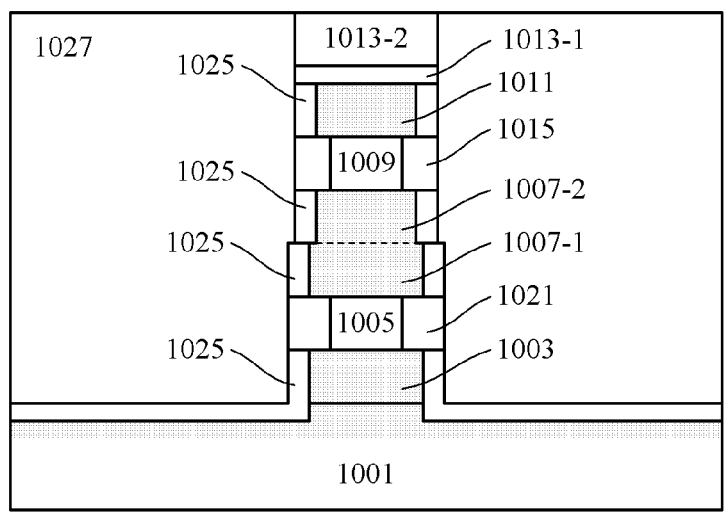
Figure 13:
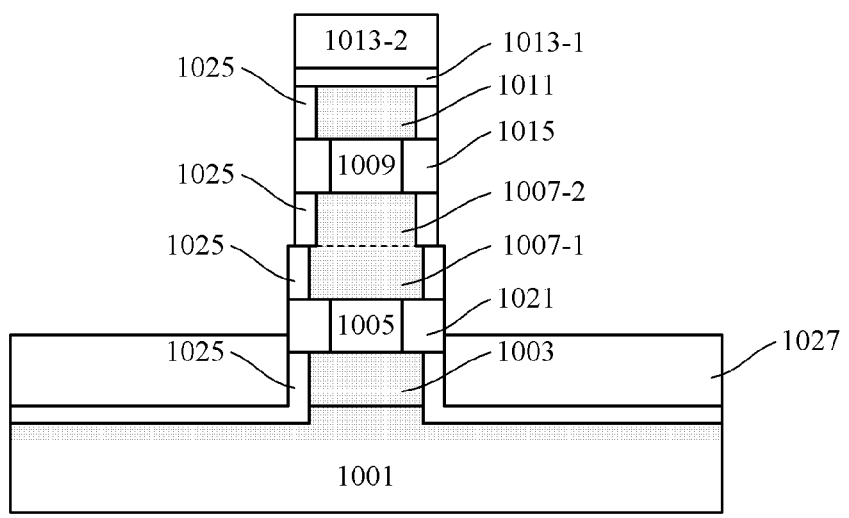

For example, as shown in FIG. 12, oxide 1027 may be deposited on the structure shown in FIG. 11, and planarized by, for example, Chemical Mechanical Polishing. The CMP may stop on the second hard mask layer 1013-2 (nitride). Then, as shown in FIG. 13, the planarized oxide may be etched back to form the first isolation layer 1027. Here, the isolation layer 1027 may have its top surface at a level between top and bottom surfaces of the first channel layer 1005, which helps to form a self-aligned gate stack. Due to the presence of the sacrificial gates 1015 and 1021, it is possible to prevent the material of the isolation layer 1027 from entering the recesses where the gate stacks are to be accommodated.

Figure 14:
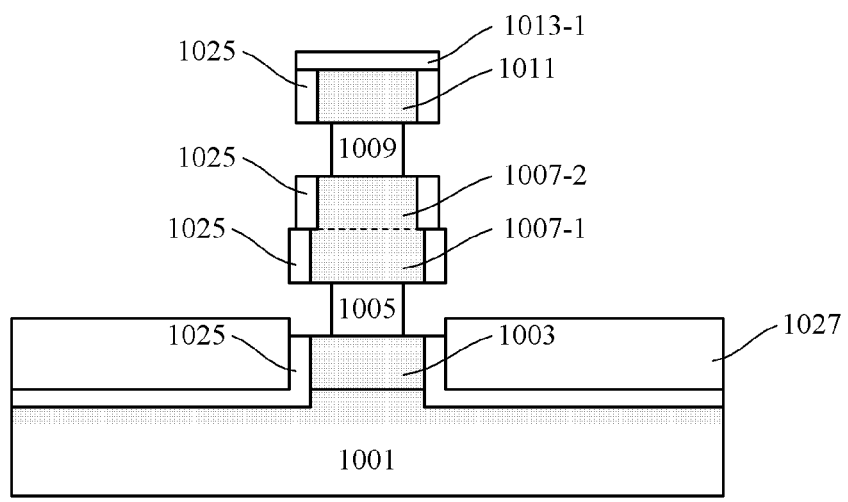

After that, as shown in FIG. 14, the sacrificial gate 1021 may be removed to release the space in the recess of the first channel layer 1005. For example, the sacrificial gate 1021 (nitride) may be removed by selective etching. In this example, the sacrificial gate 1015 and the second hard mask layer 1013-2 are also removed because they are also nitride. Further, after the sacrificial gates 1021 and 1015 are removed, cleaning may be performed to clean the surfaces of the channel layers 1005 and 1009 (by, for example, removing oxide layers possibly existing on the surfaces). In the cleaning, the first hard mask layer 1013-1 may be also removed.

Figure 15:
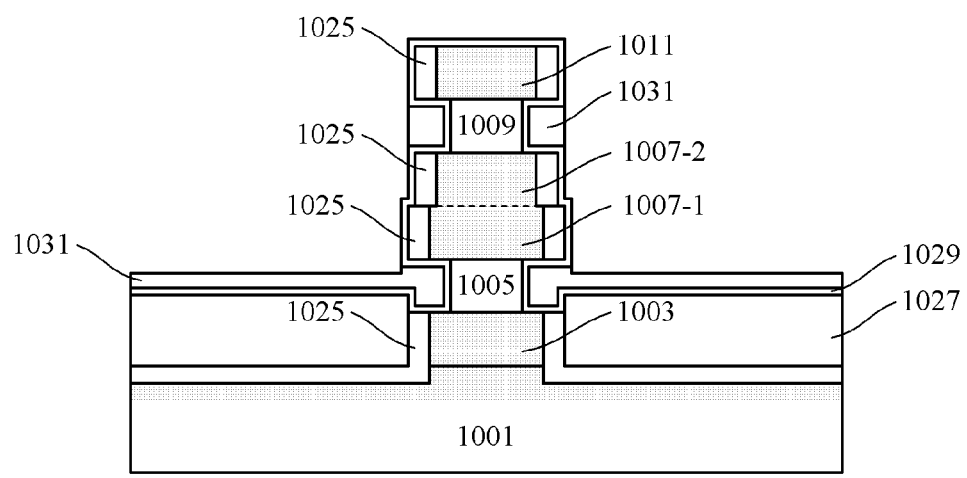

Then, as shown in FIG. 15, a gate stack may be formed in the recess of the first channel layer 1005. Specifically, a first gate dielectric layer 1029 and a first gate conductor layer 1031 may be deposited in sequence on the structure shown in FIG. 14, and then the deposited first gate conductor layer 1031 (and optionally the first gate dielectric layer 1029) may be etched back, so that a portion thereof outside the recess has its top surface at a level not higher than and preferably lower than the top surface of the first channel layer 1005. For example, the first gate dielectric layer 1029 may comprise high-K dielectric such as $HfO_2$, the first gate conductor layer 1031 may comprise a metal gate conductor. Further, there may be a work function adjustment layer disposed between the first gate dielectric layer 1029 and the first gate conductor layer 1031. An interfacial layer of, for example, oxide, may be formed before the formation of the first gate dielectric layer 1029.

In this way, the gate stack for the first semiconductor device can be embedded into and self-aligned to the recess of the first channel layer 1005, and thus overlap an entire height of the first channel layer 1005.

Further, a stack of the first gate dielectric layer 1029 and the first gate conductor layer 1031 is also formed in the recess of the second channel layer 1009.

Figure 16:
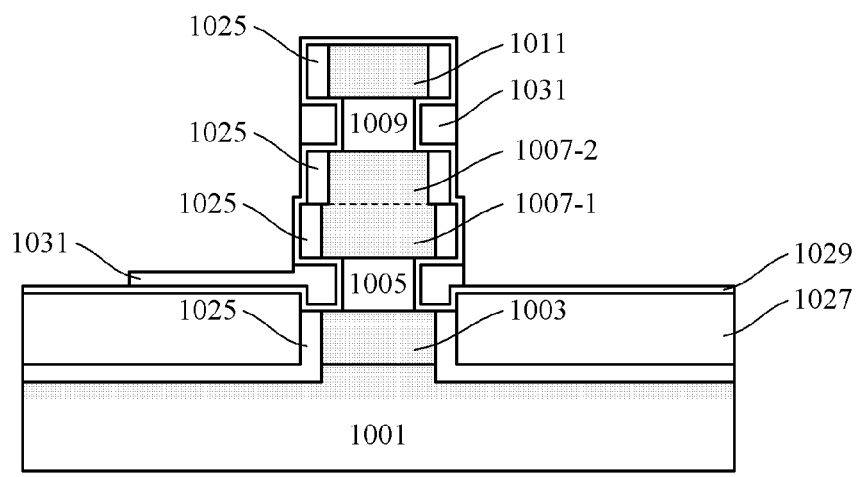

Next, the gate stack may have its shape adjusted to facilitate manufacturing of contacts later. For example, photoresist (not shown) may be formed on the structure shown in FIG. 15. The photoresist may be patterned by, for example, photolithography, to cover one portion of the gate stack outside the recess (the left portion in this example), while exposing another portion of the gate stack outside the recess (the right portion in this example). Then, the first gate conductor layer 1031 may be selectively etched by, for example, RIE, with the photoresist as a mask. Thus, the covered portion of the first gate conductor layer 1031, in addition to a portion thereof remaining in the recess, is left, as shown in FIG. 16. Later, an electrical connection to the gate stack can be achieved by this portion.

According to another embodiment, the first gate dielectric layer 1029 may be selectively etched further by, for example, RIE. After that, the photoresist may be removed.

Figure 17:
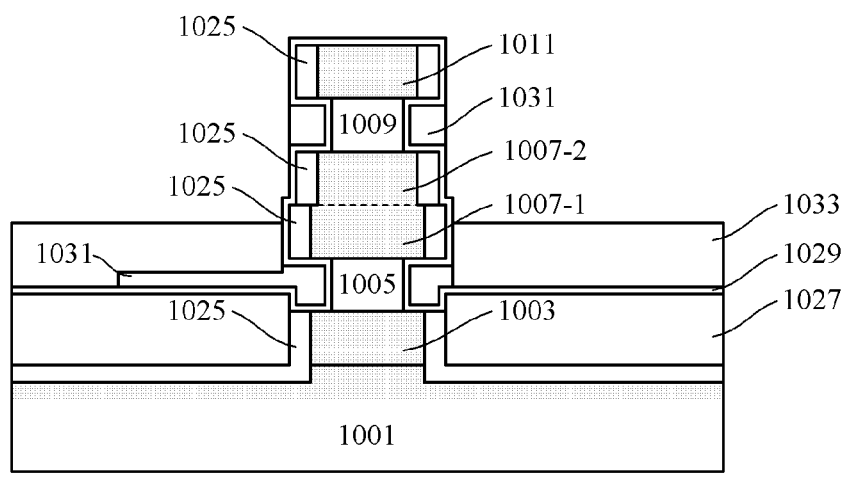

Then, as shown in FIG. 17, oxide may be deposited on the structure shown in FIG. 16, and then etched back, to form a second isolation layer 1033. After the back etching, the deposited oxide may be planarized by, for example, CMP. Here, the isolation layer 1033 may have its top surface at a level between top and bottom surfaces of the second source/drain layer 1007 (preferably, between top and bottom surfaces of the lower portion 1007-1 of the second source/drain layer), which helps to form an electrical contact layer contiguous to the source/drain region S/D-b1 of the first semiconductor device and the source/drain region S/D-t2 of the second semiconductor device.

Figure 18:
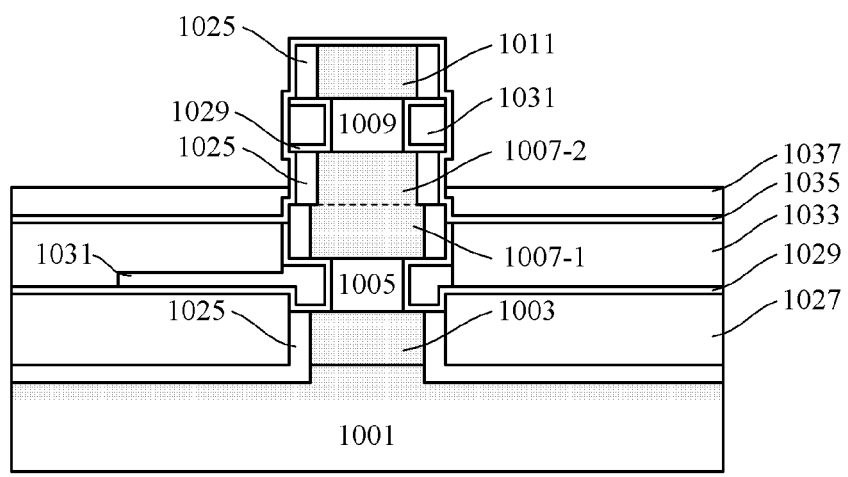

Next, as shown in FIG. 18, an electrical contact layer 1037 may be formed by depositing a conductive material on the structure shown in FIG. 17 and then etching it back. For example, the electrical contact layer 1037 may comprise metal such as W. The electrical contact layer 1037 may have its top surface at a level lower than the top surface of the second source/drain layer 1007 (preferably, not lower than the bottom surface of the upper portion 1007-2 of the second source/drain layer). Preferably, portions of the high K gate dielectric layer 1029 exposed outside may be removed, and a barrier layer 1035 such as TiN may be formed, before depositing the conductive material.

Figure 19:
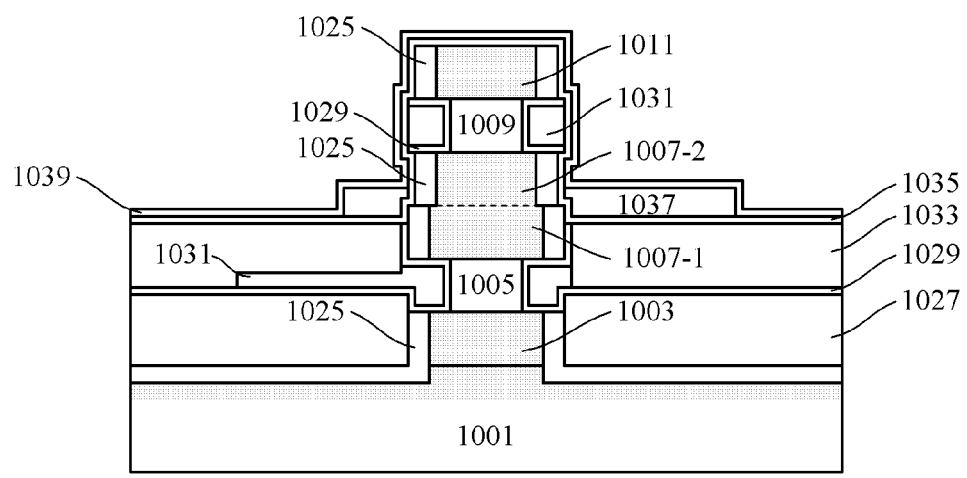

Next, the electrical contact layer 1037 may have its shape adjusted to facilitate manufacturing of interconnect later. For example, as shown in FIG. 19, the electrical contact layer 1037 may be patterned by photolithography in such a manner that a portion thereof (the illustrated right portion in this example) protrudes laterally with respect to the remaining portion thereof. Then, an electrical connection to the electrical contact layer 1037 may be achieved by this protruding portion.

Likewise, a barrier layer 1039 such as TiN may be further deposited. In this way, the barrier layers 1035 and 1039 can encapsulate the electrical contact layer 1037 to suppress its diffusion.

Figure 20:
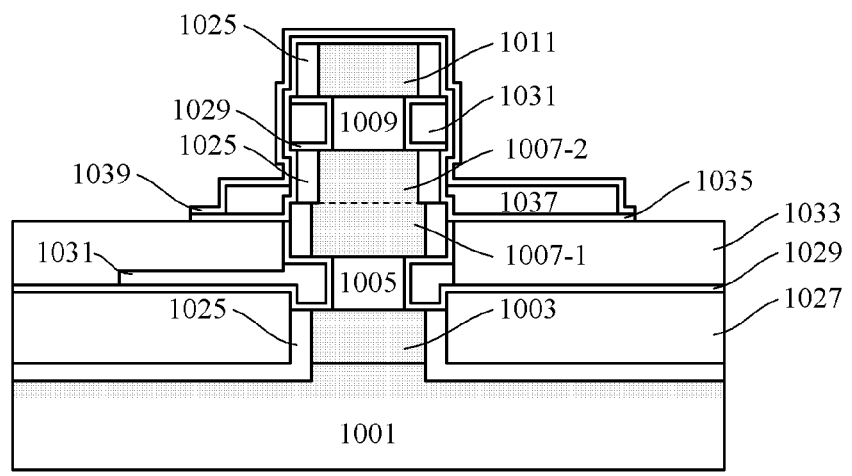
Figure 21:
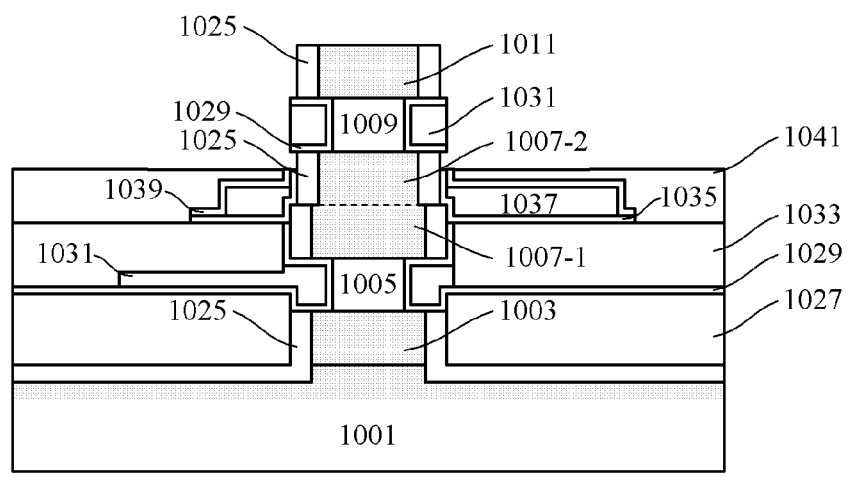
Figure 22:
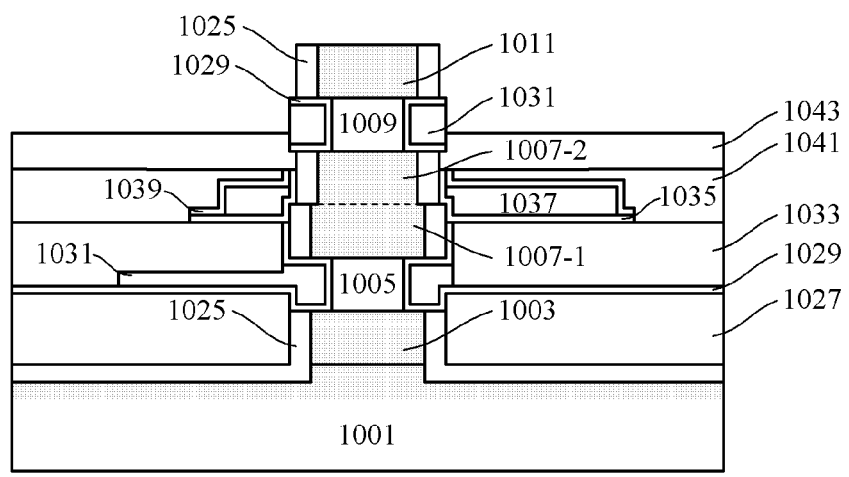

Further, redundant portions of the barrier layers 1035 and 1039 other than those used for encapsulating the electrical contact layer 1037 may be removed to avoid its impacts on the device performances (for example, there might be problems such as unwanted electric connections and parasitic capacitance caused by the conductive barrier layers present in the isolation layers). For example, this can be done as follows. As shown in FIG. 20, some of laterally extending portions of the barrier layers 1035 and 1039 on the second isolation layer 1031 may be removed by, for example, photolithography. Then, as shown in FIG. 21, a third isolation layer 1041 may be formed on the structure shown in FIG. 20 by, for example, depositing oxide and then etching it back. The third isolation layer 1041 may have its top surface at a level higher than that of a top surface of the electrical contact layer 1037, but lower than that of the bottom surface of the second channel layer 1009. After that, portions of the barrier layers 1035 and 1039 exposed by the third isolation layer 1041 may be removed. In this way, the barrier layers 1035 and 1039 extend substantially only along a periphery of the electrical contact layer 1037 (with some margin) to encapsulate the electrical contact layer 1037.

In this example, the electrical contact layer 1037 common to the first semiconductor device and the second semiconductor device is formed. However, the present disclosure is not limited thereto. Separate electrical contact layers may be formed respectively for those two devices, for example, in a case where opposing source/drain regions of the first semiconductor device and the second semiconductor device are not electrically connected to each other.

Next, a gate stack for the second semiconductor device may be formed similarly. For example, a fourth isolation layer 1043 may be formed on the structure shown in FIG. 21 by depositing oxide and then etching it back. Before the back etching, the deposited oxide may be planarized by, for example, CMP. The CMP may stop on the third source/drain layer 1011 or the silicide 1025. Here, the isolation layer 1043 may have its top surface at a level between the top and bottom surfaces of the second channel layer 1009, which helps to form a self-aligned gate stack. Due to the presence of the first gate dielectric layer 1029 and the first gate conductor layer 1031, it is possible to prevent the material of the isolation layer 1043 from entering the recess where the gate stack is to be accommodated.

Figure 23:
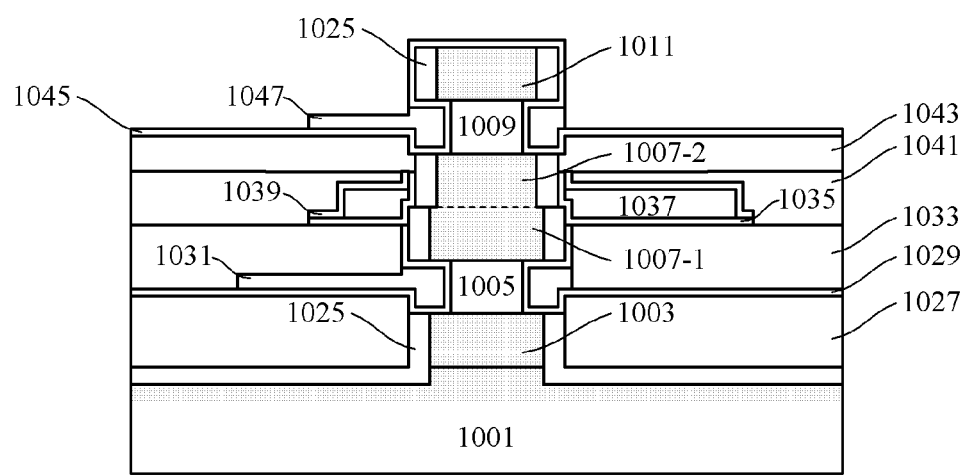

After that, as shown in FIG. 23, the first gate dielectric layer 1029 and the first gate conductor layer 1031 may be removed to release the space in the recess of the second channel layer 1009, and the gate stack for the second semiconductor device may be formed in this space, including a second gate dielectric layer 1045 and a second gate conductor layer 1047. Likewise, the gate stack may have its shape adjusted to facilitate manufacturing of contacts later. Regarding the materials and formation process for the second gate dielectric layer and the second gate conductor layer, reference may be made to the above descriptions in conjunction with FIGS. 14-16. It is to be noted that the second gate dielectric layer 1045 and the first gate dielectric layer 1029 are not necessarily the same, and that the second gate conductor layer 1047 and the first gate conductor layer 1031 are not necessarily the same.

In this way, the gate stack for the second semiconductor device can be embedded into and self-aligned to the recess, and thus overlap an entire height of the second channel layer 1009.

Figure 24:
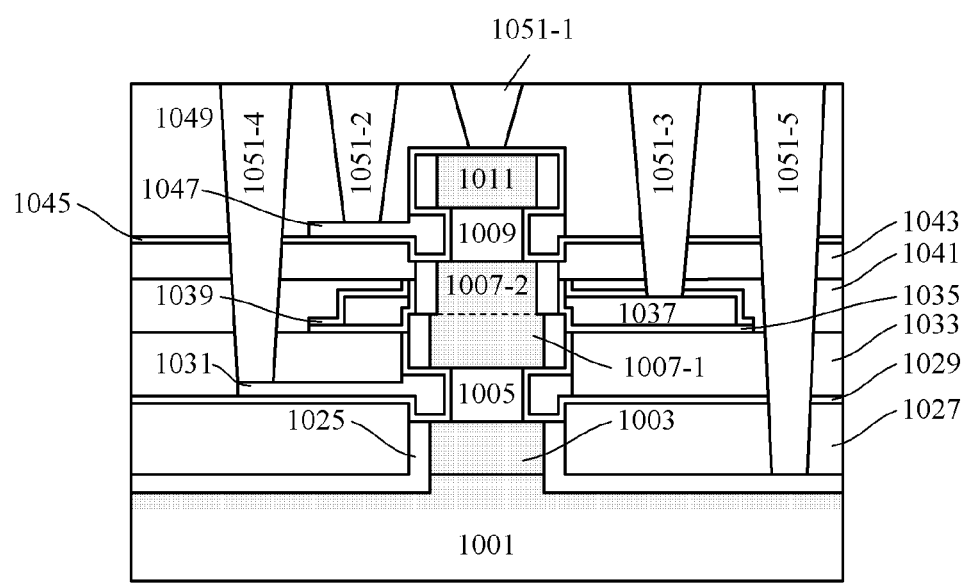

Then, as shown in FIG. 24, an interlayer dielectric layer 1049 may be formed on the structure shown in FIG. 23. For example, the interlayer dielectric layer 1049 may be formed by depositing oxide and then planarizing it by, for example, CMP. In the interlayer dielectric layer 1049, electrical contacts 1051-1 to 1051-5 to the respective source/drain regions and gate conductor layers for the first and second semiconductor devices may be formed. The contacts may be formed by etching holes in the interlayer dielectric layer 1049 and the isolation layers and then filling a conductive material such as metal in the holes.

Because the gate conductor layers 1031, 1047 and the electrical contact layer 1037 extend beyond the periphery of the active region, it is relatively easy to make the corresponding contacts 1051-2 to 1051-4. Further, because the doped region of the substrate 1001 extends beyond the active region, it is relatively easy to make the corresponding contact 1051-5.

As shown in FIG. 24, the semiconductor arrangement according to the embodiment comprises the first semiconductor device and the second semiconductor device stacked in the vertical direction. The first semiconductor device comprises the first source/drain layer 1003, the first channel layer 1005, and the second source/drain layer 1007 (or the lower portion 1007-2 thereof) stacked in the vertical direction. The first channel layer 1005 is laterally recessed, and the gate stack (1029/1031) surrounds the periphery of the first channel layer 1005 and is embedded into the recess. Likewise, the second semiconductor device comprises the second source/drain layer 1007 (or the upper portion 1007-1 thereof), the second channel layer 1009, and the third source/drain layer 1011 stacked in the vertical direction. The second channel layer 1009 is laterally recessed, and the gate stack (1045/1047) surrounds the periphery of the second channel layer 1009 and is embedded into the recess.

In this example, the two devices are illustrated to be stacked on each other. However, the present disclosure is not limited thereto. There may be more devices stacked in the vertical direction.

The semiconductor arrangement according to the embodiments is applicable to various electronic devices. For example, an Integrated Circuit (IC) may be formed by integrating a plurality of such semiconductor arrangements and also other devices (for example, transistors in other forms or the like), from which an electronic device may be made. Therefore, the present disclosure further provides an electronic device comprising the above semiconductor arrangement. The electronic device may also comprise components such as a display operatively coupled to the IC and a wireless transceiver operatively coupled to the IC, or the like. Such an electronic device may comprise, for example, a smart phone, a computer, a tablet Personal Computer (PC), a wearable smart device, a mobile power supply, or the like.

According to an embodiment of the present disclosure, there is also provided a method of manufacturing a System on Chip (SoC). The method may comprise the above method of manufacturing the semiconductor arrangement. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising a first semiconductor device and a second semiconductor device stacked in sequence on a substrate, wherein each of the first semiconductor device and the second semiconductor device comprises:
   a first source/drain layer, a channel layer and a second source/drain layer stacked in sequence, wherein the channel layer comprises a semiconductor material different from that of the first source/drain layer and from that of the second source/drain layer; and
   a gate stack surrounding a periphery of the channel layer.

2. The semiconductor arrangement of claim 1, wherein the channel layer has its periphery recessed with respect to that of the first source/drain layer and to that of the second source/drain layer.

3. The semiconductor arrangement of claim 2, wherein the second source/drain layer of the first semiconductor device is contiguous to the first source/drain layer of the second semiconductor device.

4. The semiconductor arrangement of claim 3, wherein the second source/drain layer of the first semiconductor device is integral with the first source/drain layer of the second semiconductor device.

5. The semiconductor arrangement of claim 1, wherein the channel layer comprises a single-crystalline semiconductor material.

6. The semiconductor arrangement of claim 3, further comprising:
   an electrical contact layer electrically connected to the second source/drain layer of the first semiconductor device and the first source/drain layer of the second semiconductor device.

7. The semiconductor arrangement of claim 6, wherein the electrical contact layer surrounds a periphery of the second source/drain layer of the first semiconductor device and the first source/drain layer of the second semiconductor device.

8. The semiconductor arrangement of claim 6, wherein
   the gate stack of the first semiconductor device has a laterally extending portion which laterally extends outwards from a corresponding recess,
   the electrical contact layer has a laterally extending portion which laterally protrudes with respect to the remaining portion thereof,
   the gate stack of the second semiconductor device has a laterally extending portion which laterally extends outwards from a corresponding recess,
   wherein at least some of the laterally extending portion of the gate stack of the first semiconductor device, the laterally extending portion of the electrical contact layer, and the laterally extending portion of the gate stack of the second semiconductor device extend laterally in different directions.

9. The semiconductor arrangement of claim 8, wherein if some of the laterally extending portion of the gate stack of the first semiconductor device, the laterally extending portion of the electrical contact layer, and the laterally extending portion of the gate stack of the second semiconductor device overlap with each other in a vertical direction, then among those laterally extending portions that overlap with each other, a lower one protrudes with respect to an upper one.

10. The semiconductor arrangement of claim 4, wherein
    the first source/drain layer of the first semiconductor device is a semiconductor layer epitaxially grown on the substrate, and the channel layer of the first semiconductor device is a semiconductor layer epitaxially grown on the first source/drain layer of the first semiconductor device,
    both the second source/drain layer of the first semiconductor device and the first source/drain layer of the second semiconductor device are a semiconductor layer epitaxially grown on the channel layer of the first semiconductor device,
    the channel layer of the second semiconductor device is a semiconductor layer epitaxially grown on the first source/drain layer of the second semiconductor device, and the second source/drain layer of the second semiconductor device is a semiconductor layer epitaxially grown on the channel layer of the second semiconductor device.

11. The semiconductor arrangement of claim 1, wherein the gate stack of the first semiconductor device comprises a different stack configuration from the gate stack of the second semiconductor device.

12. An electronic device comprising an Integrated Circuit (IC) comprising the semiconductor arrangement according to claim 1.

13. The electronic device according to claim 12, further comprising a display operatively coupled to the IC and a wireless transceiver operatively coupled to the IC.

14. The electronic device according to claim 12, wherein the electronic device comprises a smart phone, a computer, a tablet computer, a wearable smart device, or a mobile power supply.

* * * * *